United States Patent
Popovici et al.

(10) Patent No.: US 8,649,154 B2
(45) Date of Patent: Feb. 11, 2014

(54) METHOD FOR PRODUCING A METAL-INSULATOR-METAL CAPACITOR FOR USE IN SEMICONDUCTOR DEVICES

(75) Inventors: Mihaela Ioana Popovici, Leuven (BE); Johan Swerts, Kessel-lo (BE); Jorge Kittl, Hamme-Mille (BE); Sven Van Elshocht, Leuven (BE)

(73) Assignee: IMEC, Leuven (BE)

( * ) Notice: Subject to any disclaimer, the term of this patent is extended or adjusted under 35 U.S.C. 154(b) by 216 days.

(21) Appl. No.: 13/247,805

(22) Filed: Sep. 28, 2011

(65) Prior Publication Data

US 2012/0075767 A1  Mar. 29, 2012

(30) Foreign Application Priority Data

Sep. 28, 2010 (EP) ..................... 10181355

(51) Int. Cl.
*H01G 4/30* (2006.01)
(52) U.S. Cl.
USPC ........ 361/301.4; 361/303; 361/305; 361/311; 361/313; 361/306.1
(58) Field of Classification Search
USPC ................ 361/301.4, 301.2, 311–313, 321.1, 361/321.2, 303–305
See application file for complete search history.

(56) References Cited

U.S. PATENT DOCUMENTS

| | | | |
|---|---|---|---|
| 6,603,169 B2 * | 8/2003 | Lee ................ | 257/310 |
| 2003/0011012 A1 | 1/2003 | Rhodes | |
| 2005/0009369 A1 | 1/2005 | Nam et al. | |
| 2006/0151823 A1 | 7/2006 | Govindarajan | |
| 2006/0214205 A1 * | 9/2006 | Baniecki et al. ........... | 257/295 |
| 2007/0141778 A1 | 6/2007 | Lin et al. | |
| 2009/0134445 A1 | 5/2009 | Park et al. | |
| 2009/0297696 A1 | 12/2009 | Pore et al. | |

OTHER PUBLICATIONS

Partial European Search Report, European Patent Application No. 10181355, dated Jan. 31, 2011.
Frohlich, K. et al., "Epitaxial Growth of High-k TiO2 Rutile Films on RuO2 Electrodes", J. Vac. Sci. Technol. B, vol. 27, No. 1, Jan./Feb. 2009, pp. 266-270.
Kim, Seong Keun et al., "High Dielectric Constant TiO2 Thin Films on a Ru Electrode Grown at 250 C by Atomic-Layer Deposition", Applied Physics Letters, vol. 85, No. 18, Nov. 1, 2004, pp. 4112-4114.
Nakahara, M. et al., "Etching Technique for Ruthenium with a High Etch Rate and High Selectivity Using Ozone Gas", J. Vac. Sci. Technol. B, vol. 19, No. 6, Nov./Dec. 2001, pp. 2133-2136.

* cited by examiner

*Primary Examiner* — Nguyen T Ha
(74) *Attorney, Agent, or Firm* — McDonnell Boehnen Hulbert & Berghoff LLP

(57) ABSTRACT

Methods of manufacturing metal-insulator-metal capacitor structures, and the metal-insulator-metal capacitor structures obtained, are disclosed. In one embodiment, a method includes providing a substrate, forming on the substrate a first metal layer comprising a first metal, and using atomic layer deposition with an $H_2O$ oxidant to deposit on the first metal layer a protective layer comprising $TiO_2$. The method further includes using atomic layer deposition with an $O_3$ oxidant to deposit on the protective layer a dielectric layer of a dielectric material, and forming on the dielectric layer a second metal layer comprising a second metal. In another embodiment, a metal-insulator-metal capacitor includes a bottom electrode comprising a first metal, a protective layer deposited on the bottom electrode and comprising $TiO_2$, a dielectric layer deposited on the protective layer and comprising a dielectric material, and a top electrode formed on the dielectric layer and comprising a second metal.

13 Claims, 4 Drawing Sheets

METHOD FOR PRODUCING A METAL-INSULATOR-METAL CAPACITOR FOR USE IN SEMICONDUCTOR DEVICES

CROSS-REFERENCE TO RELATED APPLICATION

This application claims priority to European Patent Application Serial No. 10181355.8 filed Sep. 28, 2010, the contents of which are hereby incorporated by reference in their entirety.

BACKGROUND

Currently, dynamic random-access memory (DRAM) metal-insulator-metal capacitors typically use electrodes made of TiN. For future scaling of DRAM metal-insulator-metal capacitors, though, it may be desirable to use a metal electrode that does not contribute to the Equivalent Oxide Thickness (EOT) due to the oxidation of its top surface. One option, then, is to replace the TiN electrodes with electrodes made of ruthenium (Ru). Even when oxidized at the top surface, $RuO_2$ will show metal-like conductive behaviour and, as such, not contribute to the EOT. The electrodes may be deposited by Atomic Layer Deposition (ALD) or Chemical Vapour Deposition (CVD), so as to ensure good step coverage in high aspect ratio structures Further, for future scaling of DRAM metal-insulator-metal capacitors, it may be desirable to use a dielectric with a k-value higher than the k-value given by $Al_2O_3$ (e.g., around 9) and/or ZAZ ($ZrO_2/Al_2O_3/ZrO_2$) (e.g., around 40). The dielectric may, like the electrodes, be deposited by ALD or CVD to ensure good step coverage in high aspect ratio structures. ALD of high-k dielectric layers often uses ozone ($O_3$) as oxidant.

The k-value of the high-k dielectrics often depends on the crystalline structure of the material. $TiO_2$ in its rutile form has been reported to have a k-value of about 80, while only about 40 in its anatase phase. It is, however, not easy to grow $TiO_2$ in its rutile phase by ALD. It prefers to form anatase $TiO_2$, and only after high temperature anneal will anatase $TiO_2$ transform to rutile $TiO_2$. Commonly, rutile $TiO_2$ is only obtained above 750° C. However, in many metal-insulator-metal capacitor applications, anneal temperatures cannot exceed 650-700° C., due to the susceptibility to oxidation of the electrodes.

$TiO_2$ as grown on TiN by ALD is found to be either amorphous or crystallized in the anatase phase. The phase is maintained up to at least 700° C. When $O_3$ is used instead of $H_2O$ as oxidant at similar process conditions (temperature), crystalline phase formation during deposition is favoured, since $O_3$ is a stronger oxidant. For that reason, $O_3$ may be preferred as oxidant. It was also reported that, when using Ru as bottom electrode, rutile $TiO_2$ was obtained on Ru when using $O_3$ as oxidant in the ALD $TiO_2$ process at 250° C. as described by, for example, Kim et al., "High dielectric constant $TiO_2$ thin films on a Ru electrode grown at 250° C. by atomic-layer deposition," Appl. Phys. Lett., 85, 4112 (2004).

Rutile phase TiO2 can be obtained when using a crystalline template approach, such as tetragonal $RuO_2$, due to an excellent match in crystal structure between rutile tetragonal $TiO_2$ (lattice parameters: a=b=4.59 Å, c=2.96 Å) and tetragonal $RuO_2$ (lattice parameters: a=b=4.50 Å, c=3.10 Å). This has been reported by, for example, Fröhlich et al., "Epitaxial growth of high-k $TiO_2$ rutile films on $RuO_2$ electrodes," Electrochem. Solid-State Lett., 11, G19 (2008).

However, it has also been reported that $O_3$ and Ru are not compatible, as described by, for example, Nakahara et al., "Etching technique for ruthenium with a high etch rate and high selectivity using $O_3$ gas," Journal of Vacuum Science And Technology B, 19, 2133 (2001), which asserts that Ru is instantly etched when Ru is exposed to $O_3$. However, $RuO_2$ is known to be much less reactive with $O_3$.

Thus, without protection, Ru substrates are not compatible with $O_3$ based high-k deposition processes. Practical etching and roughening of the surface will take place at the initial stage of the high-k deposition. Similar problems may occur with metals other than Ru. Also when the metal is not etched by $O_3$, $O_3$ exposure will oxidize the metal and if the metal oxide is not metal-like, it will give rise to an EOT contribution and higher resistivity.

Park et al., U.S. Patent Application Pub. No. 2009/0134445, describe a metal-insulator-metal capacitor structure including a bottom electrode obtained by ALD or CVD deposition of Ru, and a dielectric comprising a $TiO_2$ layer in rutile phase. Between the Ru electrode and the $TiO_2$ layer, an $Al_2O_3$ layer is provided, obtained by ALD and with $O_3$ or $H_2O$ as oxidant. The function of the $Al_2O_3$ layer is to prevent deterioration of the interfacial characteristics between the bottom electrode and the $TiO_2$ layer and to prevent oxidation of the bottom electrode. The $TiO_2$ layer is obtained by ALD using $O_3$ as the reactive component.

However, the $Al_2O_3$ does not form an optimal template for growing $TiO_2$ in rutile form. Accordingly, after ALD deposition of the $TiO_2$ layer, an oxidation plasma treatment or oxygen ion beam irradiation treatment is required for changing portions of $TiO_2$ which had not grown in rutile form. Also, $Al_2O_3$ has a moderate k-value of about 9, and the protective layer will give an unacceptable contribution to the EOT.

Another problem in existing techniques is that low roughness of the Ru layer is not maintained when $Ru/RuO_2$ is produced by oxidation of the Ru layer. Current oxidation techniques for obtaining an $RuO_2$ layer on top of the Ru (e.g., oxidation by $O_3$ treatment or subjecting the Ru layer to an $O_2$ anneal) tend to increase the roughness of the substrate, because of unwanted etching by $O_3$ and/or because of the localized formation of $RuO_2$ crystals. There is currently no oxidation technique for Ru which preserves the smoothness of the Ru-surface.

SUMMARY

Disclosed are methods for manufacturing metal-insulator-metal capacitor structures for use in semiconductor devices. The disclosed metal-insulator-metal capacitor structures may be used in, for example, random-access memory (e.g., DRAM) devices. Other applications are possible as well.

In one aspect, a method for forming a stack of layers on a semiconductor substrate is disclosed. The method includes providing a substrate and forming on the substrate a first metal layer comprising a first metal. In some embodiments, the first metal layer may comprise an oxide of the first metal. The method further includes using atomic layer deposition with $H_2O$ as an oxidant to deposit on the first metal layer a protective layer comprising $TiO_2$. In embodiments where the first metal layer comprises the oxide of the first metal, the protective layer may be deposited on the oxide of the first metal. The method still further includes using atomic layer deposition with $O_3$ as an oxidant to deposit on the protective layer a dielectric layer comprising at least one dielectric material. The method still further includes depositing on the dielectric layer a second metal layer.

In some embodiments, the first metal may comprise ruthenium. In these embodiments, the oxide of the first metal may comprise ruthenium oxide.

In some embodiments, the at least one dielectric material may comprise $TiO_2$ in rutile phase.

In some embodiments, the protective layer may have a thickness less than about 1 nm.

In some embodiments, the method may further comprise, prior to depositing the protective layer, oxidizing the first metal layer to obtain the oxide of the first metal. Oxidizing the first metal may involve, for example, subjecting the first metal layer to an atmosphere consisting of $O_2$ or of a mixture of $O_2$ and one or more inert gases, with the total or partial pressure of $O_2$ between 0.13 Pa and 1333.22 Pa, at a temperature between 200° C. and 450° C., during an oxidation time between 1 min and 30 min. Other examples are possible as well. In general, the partial pressure, temperature, and oxidation time may be such that the roughness of the oxide of the metal layer is substantially equal to a roughness of the first metal layer.

In some embodiments, the method may further comprise producing at least one metal-insulator-metal capacitor structures on the substrate.

In another aspect, a metal-insulator-metal capacitor is disclosed. The metal-insulator-metal capacitor comprises a bottom electrode comprising a first metal. The metal-insulator-metal capacitor further comprises a protective layer formed on the bottom electrode, and a dielectric layer formed on the protective layer. The metal-insulator-metal capacitor still further comprises a top electrode comprising a second metal and formed on the dielectric layer.

In some embodiments, the first metal layer comprises an oxide of the first metal. In these embodiments, the dielectric layer may be formed on the oxide of the first metal.

In some embodiments, the protective layer may comprise an intermediate $TiO_2$ layer. Further, in some embodiments, the protective layer may have a thickness less than or equal to 1 nm.

In some embodiments, at least one of the first metal and the second metal may be ruthenium.

In yet another aspect, a method for oxidizing a metal layer is disclosed. The method comprises subjecting the metal layer to an atmosphere consisting of $O_2$ or of a mixture of $O_2$ and one or more inert gases, with the total or partial pressure of $O_2$ between 0.13 Pa and 1333.22 Pa, at a temperature between 200° C. and 450° C., during an oxidation time between 1 min and 30 min.

DETAILED DESCRIPTION

FIGS. 1A-F illustrate steps of an example method, in accordance with an embodiment.

Figure 1A:
FIGS. 1A-F illustrate steps of an example method, in accordance with an embodiment.

As shown in FIG. 1A, a substrate 1 is provided. The substrate 1 may be, for example, a silicon or other semiconductor substrate. In some embodiments, the substrate 1 may include bit lines and/or transistors (not shown).

Figure 1B:

As shown in FIG. 1B, a first metal layer 2 is deposited onto the substrate 1. The first metal layer 2 may comprise ruthenium. The first metal layer 2 may be deposited using, for example, Atomic Layer Deposition (ALD), such as Plasma Enhanced ALD (PEALD), or by CVD. In some embodiments, a layer of TiN may be deposited on the substrate 1 prior to the first metal layer 2, and the first metal layer 2 may be deposited onto the TiN layer. For example, a 10 nm layer of TiN may be deposited, followed by a 5 nm Ru layer. Other examples are possible as well.

Figure 1C:
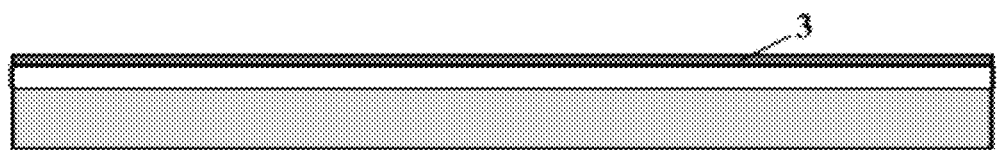

As shown in FIG. 1C, an oxide 3 may then be formed on the first metal layer 2. The oxide 3 may be, for example, a ruthenium oxide. To this end, the first metal layer 2 may be subjected to a controlled oxidation method. In some embodiments, the oxidation may be performed in a cross-flow-type ALD reactor at 250° C., resulting in formation of an oxide 3 having a thickness of about 1-1.5 nm. More generally, the oxidation may involve subjecting the first metal layer 2 to a low-pressure atmosphere comprising $O_2$ or a mixture of $O_2$ and one or more inert gases (e.g., $N_2$). The pressure or partial pressure of the $O_2$ may be between 1 mTorr and 10 Torr (i.e., between 0.13 Pa and 1333.22 Pa). The temperature during oxidation may be between 200° C. and 450° C. The oxidation time may be between 1 min and 30 min, with lower oxidation times being applicable for higher temperatures.

In embodiments where the oxide comprises ruthenium oxide, the ruthenium oxide may be, for example, $RuO_x$, where x has a value such that the ruthenium oxide has a tetragonal crystal structure. In some embodiments, x may be about 2, such that the ruthenium oxide is $RuO_2$. Alternately or additionally, in some embodiments, the ruthenium oxide may have a mismatch with rutile $TiO_2$ of less than about 2%. In the remaining disclosure, the ruthenium oxide may be referred to as $RuO_2$, for the sake of simplicity. It is to be understood, however, that other ruthenium oxides are possible as well.

Using the above oxidation processes, the oxide 3 may have a roughness that is substantially equal to a roughness of the first metal layer 2.

Figure 2A:
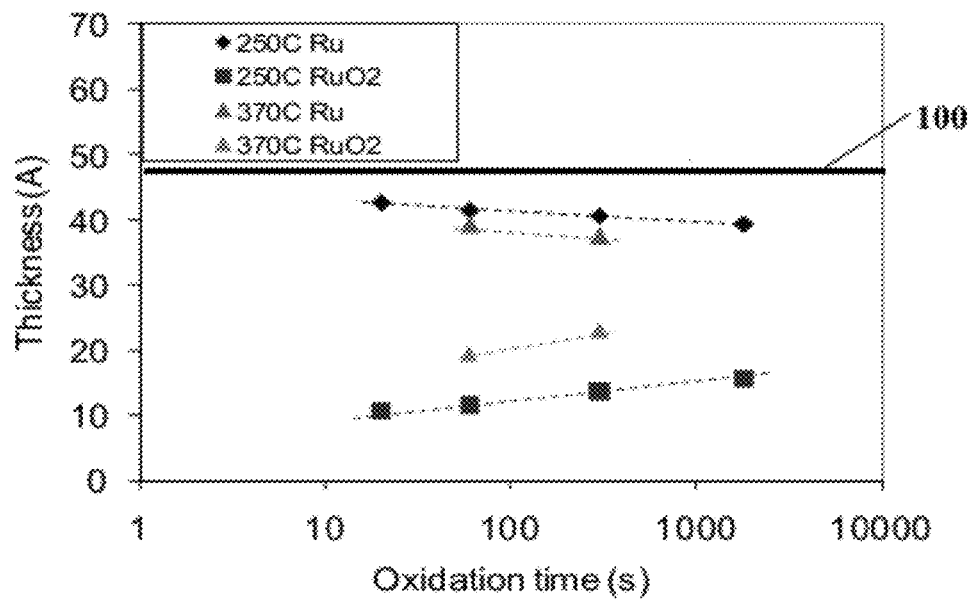
FIG. 2A shows layer thickness as a function of the oxidation time at 250° C. and 370° C. for a ruthenium layer and a ruthenium oxide formed on the ruthenium layer using an example method for oxidizing a metal layer, in accordance with an embodiment.
Figure 2B:
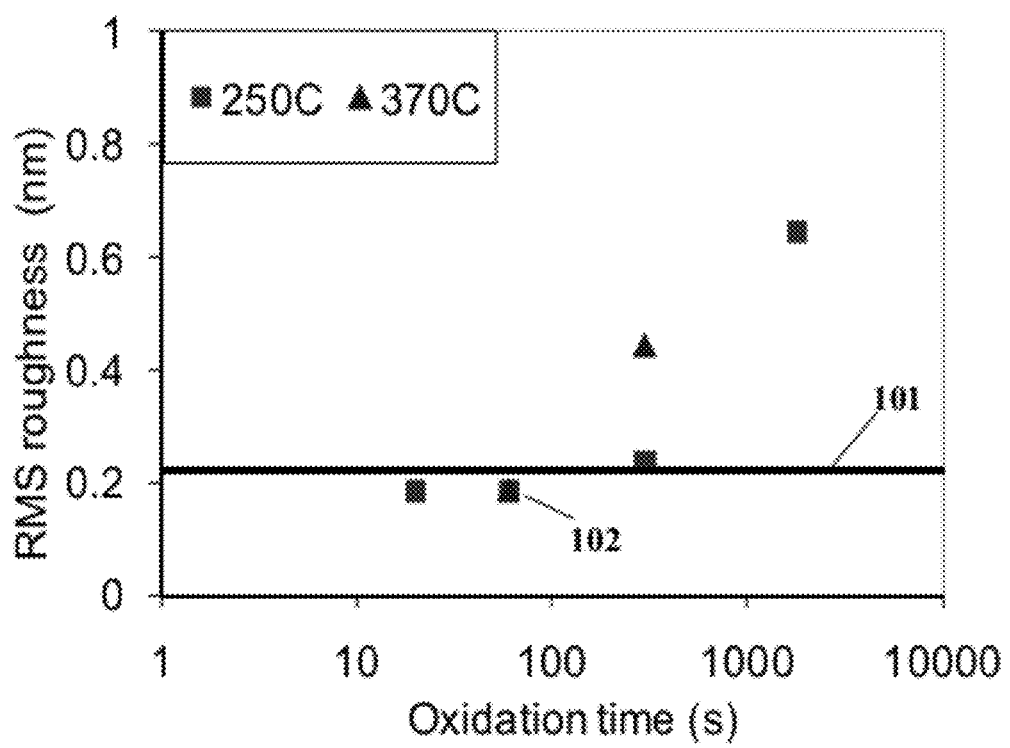
FIG. 2B shows RMS roughness values as a function of the oxidation time and at 250° C. and 370° C. for a ruthenium layer and a ruthenium oxide formed on the ruthenium layer using an example method for oxidizing a metal layer, in accordance with an embodiment.

FIGS. 2A-B show example test results for ruthenium layers and ruthenium oxides formed using the methods described herein. In particular, for the example test results, the ruthenium oxide may have been formed using a low pressure atmosphere at 1 Torr total pressure, consisting of $O_2$ and $N_2$ with $O_2$ at a partial pressure of 0.2 Torr. Other examples are possible as well.

FIG. 2A shows layer thickness as a function of the oxidation time at 250° C. and 370° C. for a ruthenium layer and a ruthenium oxide formed on the ruthenium layer using an example method for oxidizing a metal layer, in accordance with an embodiment. As shown, the ruthenium oxide has a thickness between 1 nm and 2 nm, depending on the temperature and the oxidation time. Line 100 shows the initial thickness of ruthenium layer to be about 50 Å.

FIG. 2B shows RMS roughness values as a function of the oxidation time and at 250° C. and 370° C. for a ruthenium layer and a ruthenium oxide formed on the ruthenium layer using an example method for oxidizing a metal layer, in accordance with an embodiment. An initial roughness of the ruthenium layer is labelled 101. A roughness of the ruthenium oxide is indicated by the squares (250° C.) and the triangles (370° C.). As shown, one measurement point 102 is valid for both 250° C. and 370° C., as the square and the triangle coincide.

From the results, it can be inferred that, at a temperature of 250° C., the oxidation time may be less than about 10 min in order to maintain the roughness at substantially the same value. Further from the results, it can be inferred that, at a temperature of 370° C., the oxidation time is may be less than about 5 min in order to maintain the roughness at substantially the same value. The invention thus defines a window in terms of oxidation time and temperature in which the ruthenium oxide may be formed with a roughness that is approximately equal to that of the initial ruthenium layer. The formation of such a ruthenium oxide is beneficial for the subsequent growing of rutile phase $TiO_2$, due to the matching crystal structure of ruthenium oxide and rutile $TiO_2$. Further, the low roughness of the ruthenium oxide is beneficial for the surface uniformity of the layers deposited on the ruthenium oxide.

Returning to FIG. 1C, in some embodiments, the oxide 3 may not be present.

Figure 1D:
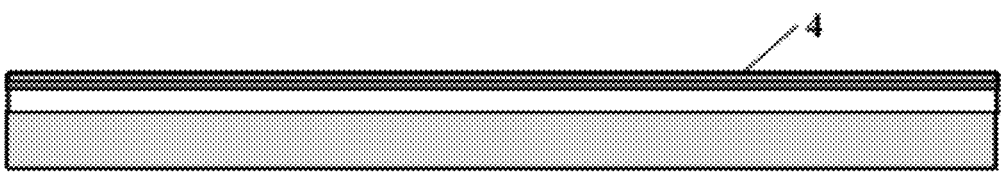

FIG. 1D shows a protective layer 4 of $TiO_2$ deposited on the oxide 3 using ALD. In embodiments where the oxide 3 is not present, however, the protective layer 4 may be formed directly on the first metal layer 2. The protective layer 4 may be formed, for example, in an ALD reactor, such as a cross-flow-type ALD reactor.

In some embodiments, the protective layer 4 may be formed through one or more deposition cycles, each of which may include providing a Ti-precursor (e.g., $Ti(OCH_3)_4$) onto the surface of the first metal layer 2 or the oxide 3, purging the reaction chamber (e.g., by a flow of $N_2$-gas), adding $H_2O$ as the oxidant in vapour form, and again purging the reaction chamber (e.g., again by a flow of $N_2$-gas).

In some embodiments, the deposition temperature may be about 250° C. Further, the pressure may be between 1 and 3 Torr. In some embodiments, the providing step may have a duration of 2 s, the purging step may have a duration of 4 s, the adding $H_2O$ step may have a duration of 4 s, and the again purging step may have a duration 8 s. Such ALD parameters may lead to a growth per cycle of about 0.04 nm per cycle. Other examples are possible as well.

In some embodiments, the thickness of the protective layer 4 may be less than 1 nm, or even less than 0.6 nm.

Figure 1E:
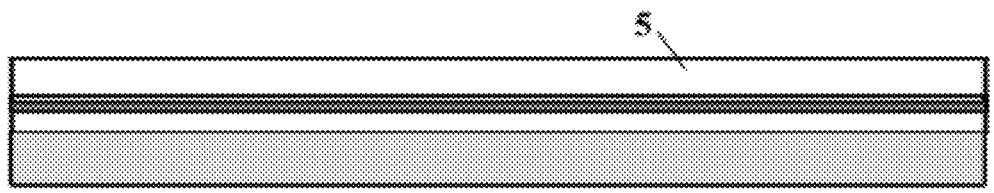

As shown in FIG. 1E, a dielectric layer 5 of $TiO_2$ may be deposited on the protective layer 4. The dielectric layer 5 may also be deposited by ALD. In some embodiments, the dielectric layer 5 may be formed through one or more deposition cycles, each of which may include providing a Ti-precursor (e.g., $Ti(OCH_3)_4$) onto the surface of the protective layer 4, purging the reaction chamber (e.g., by a flow of $N_2$-gas), adding $O_3$-gas as the oxidant, and again purging the reaction chamber (e.g., again by a flow of $N_2$-gas).

In some embodiments, the deposition temperature may be about 250° C. Further, the pressure may be between 1 and 3 Torr. In some embodiments, the providing step may have a duration of 4 s, the purging step may have a duration of 5 s, the adding $H_2O$ step may have a duration of 4 s, and the again purging step may have a duration 8 s. Other examples are possible as well.

In some embodiments, the thickness of the dielectric layer 5 may be between 5 nm and 20 nm. Other examples are possible as well.

In some embodiments, during or following deposition, dopants may be added to the dielectric layer 5. Example dopants include Sr, Ta, Al, Hf, Gd, Zr, Sc, Dy.

The oxide 3 and the protective layer 4 may serve to protect the first metal layer 2 from etching during deposition of the dielectric layer 5. Further, in embodiments where the protective layer 4 has a thickness that is less than about 1 nm, a crystal structure of the oxide 3 may be transferred onto the protective layer 4, such that rutile $TiO_2$ is more easily formed during deposition of the dielectric layer 5. In embodiments where the oxide layer 3 is not formed, however, the dielectric layer may not be entirely in rutile phase. The advantage of protecting the first metal layer 1 from etching by $O_3$ is, however, maintained.

Figure 1F:
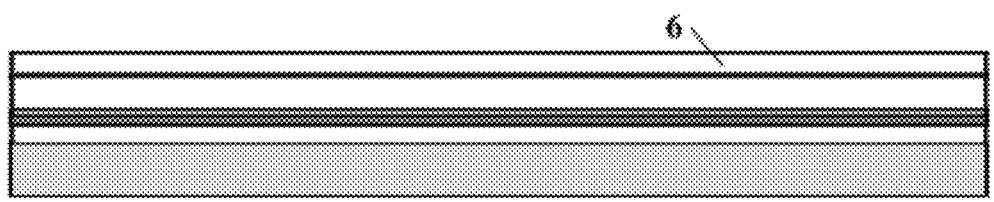

As shown in FIG. 1F, a second metal layer 6 is deposited on the dielectric layer 4. The second metal layer 6 may be ruthenium, like the first metal layer 1, or may be TiN. Other metals are suitable as well.

The first metal layer 1 may eventually serve as the bottom electrode of an metal-insulator-metal capacitor. To this end, it may be desirable to use a metal whose oxide does not contribute to the EOT, such as molybdenum.

In some embodiments, the dielectric layer 5 may comprises a material other than $TiO_2$, such as, for example, $Al_2O_3$, titanium aluminium oxide, $ZrO_2$, $HfO_2$, strontium titanium oxide.

Figure 3:
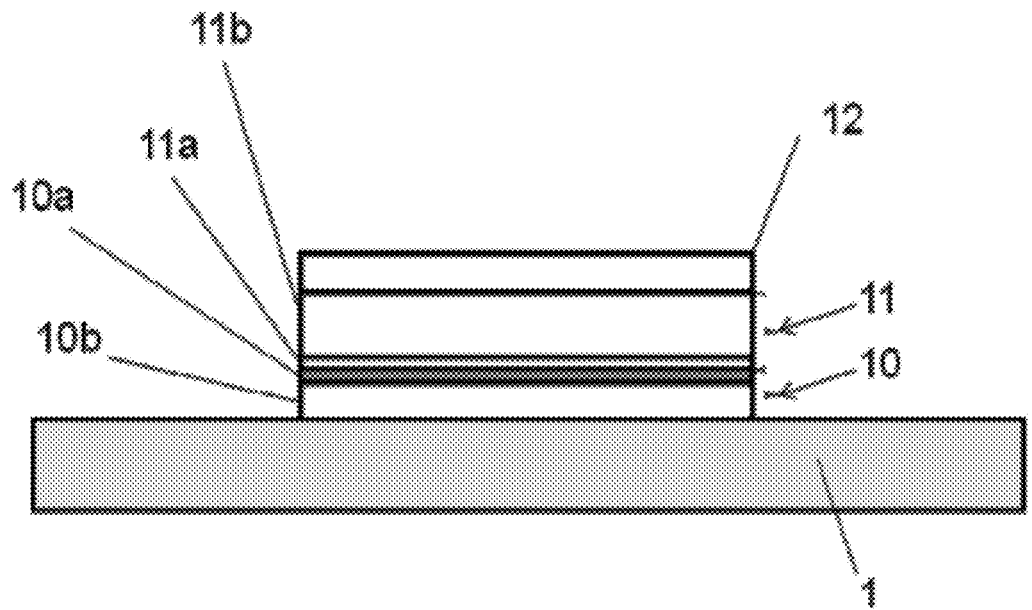
FIG. 3 illustrates a metal-insulator-metal capacitor structure, in accordance with an embodiment.

Using the above method, a metal-insulator-metal capacitor may be obtained. FIG. 3 illustrates a metal-insulator-metal capacitor structure, in accordance with an embodiment. As shown in FIG. 3, the example metal-insulator-metal capacitor structure comprises a bottom electrode 10 including a ruthenium layer 10B and a ruthenium oxide 10A. The ruthenium oxide 10A may have a thickness between, for example, 1 and 2 nm. Other examples are possible as well. The metal-insulator-metal capacitor structure further includes a protective-dielectric layer 11 comprising a first layer of $TiO_2$ to serve as a protective layer 11A and a second layer of rutile $TiO_2$ to serve as a dielectric layer 11B. The protective layer 11A may have a thickness less than about 1 nm. Further, the protective layer 11A may have a structure defined by the ruthenium oxide 10A underneath, such that the protective layer 11A is suitable for growing the rutile $TiO_2$ of the dielectric layer 11B. In embodiments where both the protective layer 11A and the dielectric layer 11B comprise $TiO_2$, the protective layer 11A and the dielectric layer 11B may not be distinguishable in the finished metal-insulator-metal capacitor structure. As shown, the metal-insulator-metal capacitor structure further comprises a top electrode 12.

Figure 4:
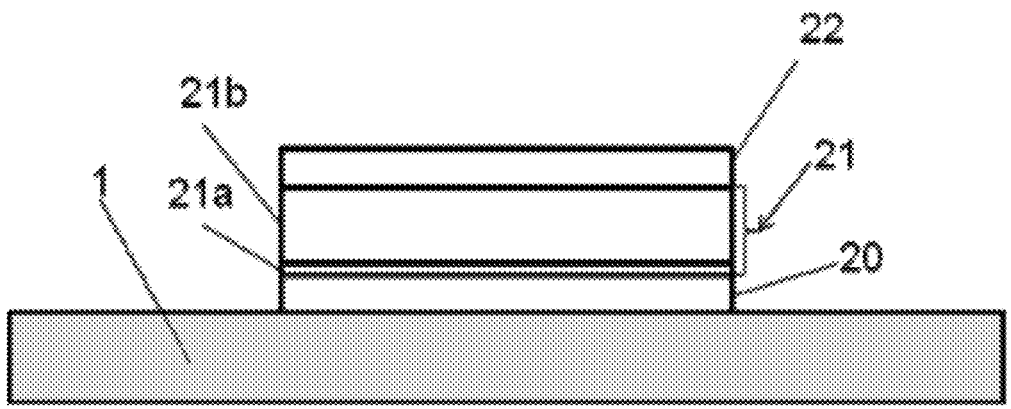
FIG. 4 illustrates another metal-insulator-metal capacitor structure, in accordance with an embodiment.

FIG. 4 illustrates another metal-insulator-metal capacitor structure, in accordance with an embodiment. As shown, the metal-insulator-metal capacitor structure includes a bottom electrode 20. The bottom electrode 20 may be or may include a ruthenium layer (not shown). The metal-insulator-metal capacitor structure further comprises a protective-dielectric layer 21 including a protective layer 21A and a dielectric layer 21B. The protective layer 21A may have a thickness less than about 1 nm. The protective layer 21A may comprise $TiO_2$, while the dielectric layer 21B may comprise rutile $TiO_2$ or another dielectric. The metal-insulator-metal capacitor structure further comprises a top electrode 22.

As described above, the bottom electrode may be oxidized to form an oxide layer. To this end, the bottom electrode (or a metal layer in the bottom electrode) may be subjected to a low-pressure atmosphere consisting of $O_2$ or consisting of a mixture of $O_2$ and one or more inert gases such as $N_2$. The pressure or partial pressure of $O_2$ may be between 1 mTorr and 10 Torr (between 0.13 Pa and 1333.22 Pa), and the temperature during oxidation may be between 200° C. and 450° C. The oxidation time may between 1 min and 30 min, with lower oxidation times being applicable for higher temperatures. Using such an oxidation method, it may be possible to obtain an oxide on the bottom electrode having a roughness that is substantially equal to a roughness of the bottom electrode (or a metal layer in the bottom electrode).

A number of example tests were performed. In one example, a test was done to obtain atomic layer deposition of rutile $TiO_2$ crystalline at 250° C. on oxidized ruthenium. The layers were characterized by spectroscopic ellipsometry (SE), X-ray reflectometry (XRR), X-ray diffraction (XRD), scanning electron microscopy (SEM), transmission electron microscopy (TEM), time of flight (TOF)-secondary ion mass spectrometry (SIMS), capacitance-voltage (C-V), and current density-voltage (J-V). Films were grown in a cross flow-type ALD reactor on 1.5 nm $RuO_2$/4 nm Ru/10 nm TiN/Si (100) wafers (300 mm diameter) at 250° C. using $Ti(OCH_3)_4$ and $O_3$ and/or $H_2O$ as oxidant. For comparison, ALD $TiO_2$ films were also grown on 10 nm PVD TiN/20 nm $SiO_2$/Si (100) substrates.

$TiO_2$ showed a self-limiting growth with $H_2O$ or $O_3$ as oxidant and a similar growth per cycle (GPC) i.e. ~0.04 nm/cycle. On the other hand, clear differences in microstructure were observed between $H_2O$ and $O_3$, as function of starting surface. Grazing incidence XRD (GIXRD) measurements showed that $TiO_2$ grown on TiN was amorphous using a $H_2O$ based process or anatase for an $O_3$-based process due to stronger oxidant potential of $O_3$.

With Ru as a substrate, amorphous $TiO_2$ was again grown with $H_2O$, but was rutile using $O_3$. Finally, on $RuO_2$/Ru, a water-based process led to anatase formation, while $TiO_2$ with $O_3$ formed rutile as well. The formation of rutile $TiO_2$ for both Ru and $RuO_2$ as a substrate for the $O_3$-based process is due to the formation of $RuO_2$ already during the first $O_3$ pulses. In both cases (Ru and $RuO_2$/Ru) using $O_3$ as oxidant, part of the Ru bottom electrode was heavily etched down to the TiN underlayer resulting in a highly non-uniform layer. To prevent this, an etch stop layer of ~0.3 nm $TiO_2$ using $H_2O$ was deposited before the remainder of the bulk of $TiO_2$ layer using an $O_3$ based process. Wafer ellipsometry maps of the Ru layer clearly showed the beneficial effect of this intermediate layer. The $H_2O$ based part of the process prevented the etching, while the $O_3$ yielded the desired rutile phase.

What is claimed is:

1. A metal-insulator-metal capacitor, comprising:
a bottom electrode comprising a first metal;
a protective layer deposited on the bottom electrode and comprising $TiO_2$;
a dielectric layer deposited overlying and in contact with the protective layer and comprising a dielectric material; and
a top electrode formed on the dielectric layer and comprising a second metal.

2. The metal-insulator-metal capacitor of claim 1, wherein at least one of the first metal and the second metal comprises ruthenium.

3. The metal-insulator-metal capacitor of claim 1, wherein the protective layer has a thickness that is less than about 1 nm.

4. The metal-insulator-metal capacitor of claim 1, wherein the dielectric layer comprises $TiO_2$ in rutile phase.

5. The metal-insulator-metal capacitor of claim 1, further comprising an oxide formed between the first metal layer and the protective layer.

6. The metal-insulator-metal capacitor of claim 5, wherein the dielectric layer has a lattice mismatch with the oxide of less than about 2%.

7. The metal-insulator-metal capacitor of claim 5, wherein the protective layer has a crystal structure substantially similar to a crystal structure of the oxide.

8. The metal-insulator-metal capacitor of claim 5, wherein the oxide comprises ruthenium oxide.

9. The metal-insulator-metal capacitor of claim 8, wherein the dielectric layer comprises $TiO_2$ in rutile phase.

10. The metal-insulator-metal capacitor of claim 9, wherein the first metal comprises ruthenium.

11. The metal-insulator-metal capacitor of claim 1, wherein the top electrode comprises one of ruthenium and titanium nitride.

12. The metal-insulator-metal capacitor of claim 1, wherein the dielectric layer is doped with one of strontium, tantalum, aluminium, hafnium, gadolinium, zirconium, scandium, and dysprosium.

13. The metal-insulator-metal capacitor of claim 1, wherein the bottom electrode comprises a ruthenium oxide layer and a ruthenium layer.

* * * * *